United States Patent
Martinache et al.

(10) Patent No.: US 6,552,547 B2
(45) Date of Patent: Apr. 22, 2003

(54) CIRCUIT FOR THE EXCITATION AND RECOVERY OF THE SIGNAL EMITTED BY A PROBE IN AN NMR SPECTROMETRIC APPARATUS

(75) Inventors: Laurent Martinache, Marienthal (FR); Olivier Gonella, Bischwiller (FR); Jean-Max Tyburn, Wissembourg (FR); Christian Brevard, Wissembourg (FR)

(73) Assignee: Bruker Biospon SA, Wissembourg (FR)

( * ) Notice: Subject to any disclaimer, the term of this patent is extended or adjusted under 35 U.S.C. 154(b) by 0 days.

(21) Appl. No.: 10/053,671

(22) Filed: Jan. 24, 2002

(65) Prior Publication Data

US 2002/0121898 A1 Sep. 5, 2002

(30) Foreign Application Priority Data

Jan. 24, 2001 (FR) .............................. 01 00942

(51) Int. Cl.[7] .................................................. G01V 3/00
(52) U.S. Cl. ...................................... 324/322; 324/318
(58) Field of Search ............................... 324/322, 318, 324/307, 309, 319, 320; 124/653.5

(56) References Cited

U.S. PATENT DOCUMENTS 3,795,855 A * 3/1974 Browing .................. 324/0.5 R
5,208,537 A 5/1993 Rietsch et al. ............... 324/322
5,552,710 A 9/1996 Busse-Grawitz et al. ... 324/322
5,565,779 A 10/1996 Arakawa et al. ............ 324/318
6,054,858 A 4/2000 Dumoulin et al. .......... 324/322

FOREIGN PATENT DOCUMENTS

FR 2 769 370 4/1999

OTHER PUBLICATIONS

XP-002173752, Fisher et al., "A Versatile Computer-Controlled Pulsed Nuclear Quadrupole Resonance Spectrometer", pp. 4676-4681, 08/99.

* cited by examiner

Primary Examiner—Edward Lefkowitz
Assistant Examiner—Brij B. Shrivastav
(74) Attorney, Agent, or Firm—Young & Thompson

(57) ABSTRACT

An excitation circuit of a probe for measuring and recovering the signal emitted in return by this latter in an NMR spectrometric apparatus, connecting the probe under conditions defined by switching elements forming a portion of the circuit, to a high frequency excitation signal generator by a portion of the line or emission line, and by a portion of the line or reception line, to a receiver for acquiring and using signals emitted by the probe as a function of the specimen to be analyzed which it contains, a device being provided to carry out or verify the tuning of the measuring probe with the excitation signal generator, associated with the circuit. The device includes a directive coupler, mounted to the portion of the emission line.

9 Claims, 3 Drawing Sheets

CIRCUIT FOR THE EXCITATION AND RECOVERY OF THE SIGNAL EMITTED BY A PROBE IN AN NMR SPECTROMETRIC APPARATUS

DESCRIPTION

The present invention relates to the field of NMR analysis apparatus, particularly the frequency agreement of measuring probes of these apparatus under conditions of analysis to be carried out, and has for its object a device or mounting of circuits for frequency tuning of an NMR probe.

NMR spectrometric apparatus (nuclear magnetic resonance) is comprised principally of a high frequency signal generator, a measuring probe disposed in the field of a magnet of high homogeneity and stability, and a receiver.

The principle of operation of an NMR measurement consists in exciting the specimen placed in the measuring probe, by high frequency impulse, then recording the response as to frequency. The spectral information contained in this latter permits an analysis of the molecular structure of the specimen.

Figure 1:
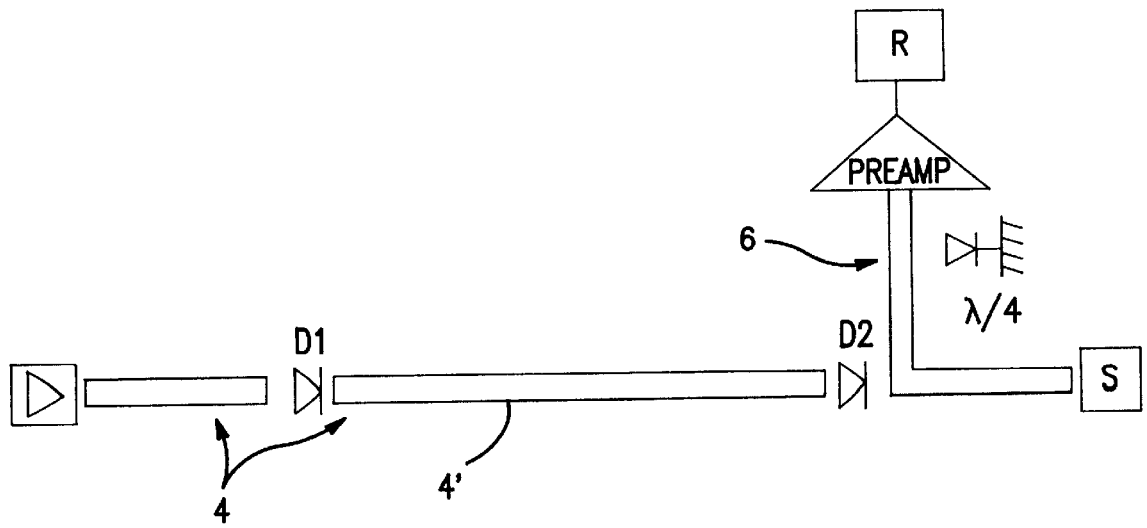

A conventional circuit arrangement for excitation of such a probe S and the signal emitted in return by this latter and received by a suitable receiver R, normally preceded by a preamplifier (PREAMP), is shown schematically in FIG. 1 of the accompanying drawings.

Before any measurement, the user must first make sure that the measuring probe is well tuned to the working frequency used for carrying out the measurement. This means that the high frequency wave must be absorbed by the probe without energy reflection.

Figure 2:
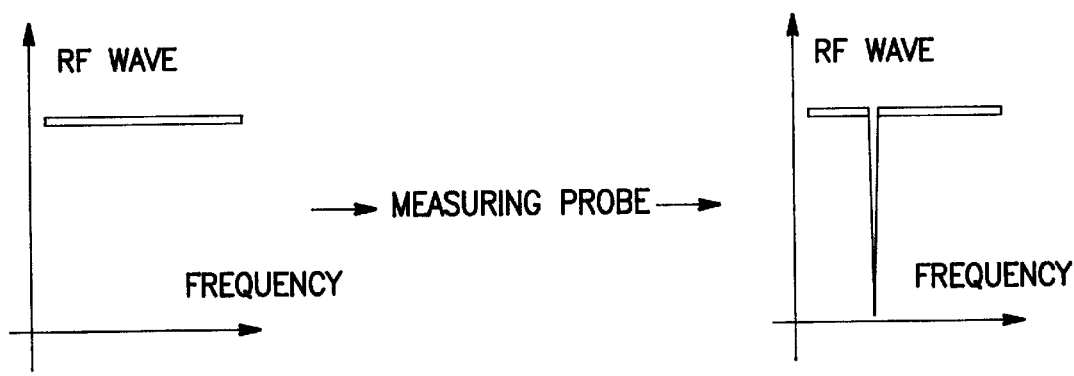

To this end, modern spectrometers are provided with a scanning device which permits visualizing the proportion of the energy reflected by the probe as a function of the frequency, this preliminary measurement or more particularly its graphic representation, is generally called the image of the mode of measurement probe (see FIG. 2 of the accompanying drawings).

Figure 3:
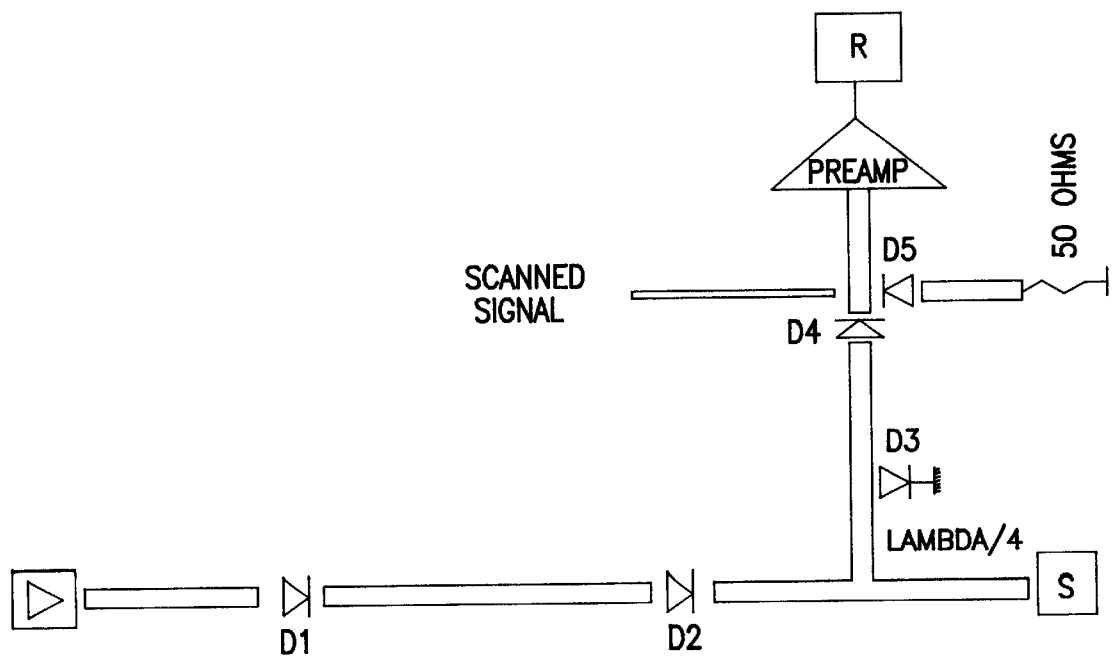

An arrangement used at present to verify the tuning of the measuring probe is shown in FIG. 3. It comprises a high frequency switching element (in general a PIN diode shown in FIG. 3 at D4) inserted between the probe S and the receiver R, so as to give to this latter either the image of the energy reflected by the probe, or a suitable load (50 OHMS) having no reflection. By vectorial subtraction of the two images (image of the probe and image of the reference), the real reflection profile of the probe undergoing test is deduced.

This necessary mathematical processing operation has several drawbacks. Thus, the radiation swept as to frequency is inserted toward the probe but also toward the receiver, which gives rise to a stationary wave phenomenon which should be corrected by measurement of the suitable reference load (50 OHMS). This arrangement also has the drawback of requiring the presence of a switching element upstream of the receiver, which impairs its sensitivity.

Moreover, it is also known to use a reference line, so as to be able to carry out a correction of the image of the probe by a reference image.

Figure 4:
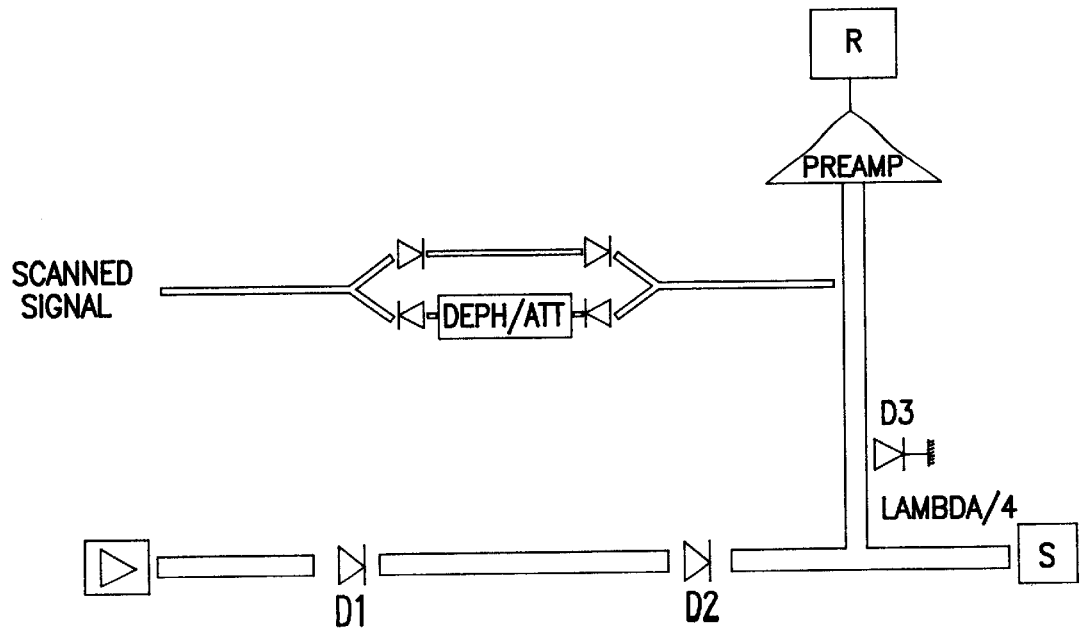

An arrangement using this solution is particularly described and shown in U.S. Pat. No. 5,552,710 (see FIG. 4 of the accompanying drawings) and permits, relative to the mentioned arrangement conventionally used, to be free from any supplemental switching element.

The use of the arrangement of this document consists in directing the high frequency wave into two separate channels after which the image of the probe S or the reference image is recorded.

During acquisition of the reference image, one of the existing switching diodes D3 is passive. The swept signal passes through the reference route, as reflected on D3 and supplies the preamplifier (PREAMP) preceding the receiver R.

The reference channel is particularly calibrated in the factory as to the amplitude and phase such that the signal received by the receiver R will be identical to that which would have been received if the measuring probe had been replaced by a suitable load.

This reference image is to a certain extent the ideal image to be sought. By the other channel, the image of the probe is measured as in the conventional arrangement mentioned above, and the final image is obtained by vectorial subtraction of the two images.

The drawback of this last arrangement is that it requires a complex circuitry, resulting in complicated assembly, to ensure good balancing of the two channels as to amplitude and phase. This arrangement is also very limited as to the passing band.

The present invention has particularly for its object to overcome the drawbacks of the known devices and arrangements mentioned above and to provide an arrangement permitting easy tuning of the probes of spectrometers, guaranteeing maintenance of the sensitivity of the receiver, without the addition of a switching component between the probe and the receiver and having a simple structure.

To this end, the present invention has for its object an excitation circuit of a probe for measuring and recovering the signal emitted in return by this latter in an NMR spectrometric apparatus, connecting said probe, under conditions defined by switching means forming a part of said circuit, to a generator of high frequency excitation signals by a portion of an emission line and by a portion of a reception line, to a receiver for acquisition and exploitation of the signals emitted by said probe as a function of the specimen to be analyzed which it contains, a device being moreover provided to carry out or verify the tuning of the measuring probe with the excitation signal generator, associated with or integrated into said circuit, which circuit is characterized in that said device comprises a directive coupler, mounted in series in or in parallel to the portion of emission line.

Figure 5:
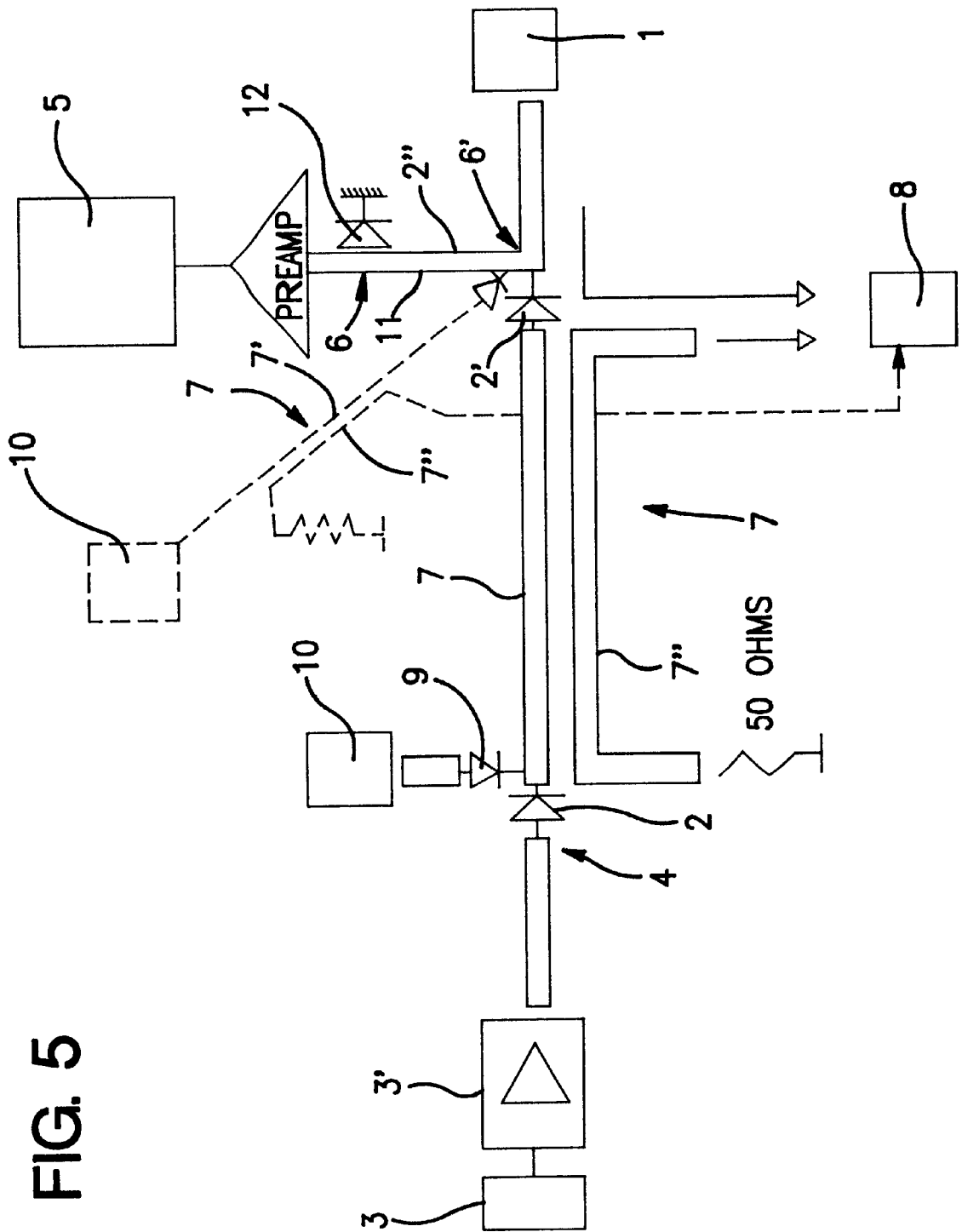

The invention will be better understood from the following description, which relates to a preferred embodiment, given by way of non-limiting example, and explained with reference to the accompanying schematic drawings, in which FIG. 5 is a functional schematic view of the device according to the invention.

As shown in FIG. 5 of the accompanying drawings, the excitation circuit of a measuring probe 1 for recovery of signal emitted in return by this latter in an NMR spectrometric apparatus (not shown), connects said probe, under conditions defined by switching means forming a part of said circuit, to a high frequency excitation signal generator 3 by a portion of the line or emission line 4 and, by a portion of the line or reception line 6, to a receiver 5 for the acquisition and exploitation of the signals emitted by said probe as a function of the specimen to be analyzed which it contains, a device being moreover provided to carry out or verify the tuning of the measuring probe 1 with the excitation signal generation, the device being associated with or integrated into said circuit.

According to the invention, this circuit is characterized in that said device comprises a directive coupler 7, mounted in series in or parallel to the portion of the emission line 4.

The directive coupler 7 permits separating the wave emitted toward the probe 1 and incident on this latter, from the wave reflected in return by said measurement probe 1.

Thus, during emission of the signal swept as to phase for tuning the probe, said directive coupler 7, connected to a suitable generator 10, permits producing a real image of the reflection energy produced by the measuring probe 1 as a function of the frequency, without requiring a supplemental switching component in series between the measuring probe 1 and the receiver 5 and whilst maintaining a very simple structure, not subject to sensitive adjustments to be obtained and preserved.

The directive coupler 7 will preferably have a directivity (coupling+insulation), over a wide band, at least equal to 30 dB and could for example be of the type known by the designation 10013-30 of the ANAREN company, its second line being balanced by a suitable load (50 Ohms).

According to a first modification of embodiment, whose particular characteristics are shown in broken or pointed lines in FIG. 5, the directive coupler 7 is mounted in parallel on the emission line 4 and connects, in a controlled manner, to this latter by its principal line by means of a switching element 2", said principal line 7' being supplied for the verification of tuning, by a swept signal and the secondary line 7" of said coupler 7 being thus connected, at its terminal opposite the terminal of the principal line supplied by the swept signal, to a means 8 for acquisition and visualization of the spectral response corresponding to the wave reflected by the measuring probe 1, preferably the acquisition and visualization means of the spectrometric apparatus.

According to a second preferred embodiment of the invention, shown in full lines in FIG. 5 (omission of the details in broken lines), the directive coupler 7 is mounted in series in the emission line 4. In this case, the principal line 7' of said directive coupler 7 forms a portion of said emission line 4 and it is directly connected by suitable switching means 2, 9, to the excitation signal generator 3 or to the swept signal generator 10, the secondary line 7" being or being adapted to be connected at its terminal opposite to the terminal of the principal line 7' supplied by the signal from the excitation generator 3, to a means 8 for the acquisition and visualization of the wave reflected by the measuring probe 1, preferably the acquisition and visualization means of the spectrometric apparatus.

So as to bring together as much as possible the conditions for measuring in the verification phase of the latter prevailing in the phase of effective use of the spectrometric apparatus, which is to say during analysis of specimens excited by signals emitted from the generator 3, the directive coupler 7 is preferably mounted adjacent and preferably as near as possible to the output of generator 3 for excitation signals or of an amplification module or component 3' following it.

According to a preferred embodiment of the invention, shown in FIG. 5 and taken in connection with FIG. 1, it is provided that the emission line 4 comprise switching means in the form of two diodes 2 and 2' mounted in series and that the directive coupler 7 be mounted such that its principal line 7' forms at least one portion (preferably all) of the segment of emission line 4' extending between the two diodes 2 and 2'.

By producing during the reference phase (tuning of the probe) a blockage of the diode 2', it is possible to visualize and acquire, by the means 8, possible imperfections resulting from the generator 10 and from the transmission line connecting 10 to 8 (and including particularly the directive coupler 7).

This measurement can prove to be very interesting when the working frequencies are comprised between several MHz and several hundreds of MHz.

Thus, it promotes particularly the automation of the tuning of the probe, because the curve displayed by the means 8 will be the real image of the probe, which is to say corrected for imperfections due to the transmission line comprising particularly the coupler 7, said imperfections arising with respect to the display of the acquisition of the image of the probe to derive them from the received signal.

Thus it will be possible to accelerate the process of tuning the probe and to carry it out, for example before each measuring sequence, by guaranteeing taking into account the possible development of the mentioned imperfections.

So as to avoid any pollution of the receiver during the emission phase, the preamplifier preceding the receiver 5 should be isolated.

To this end, the receiving line 6 comprises, immediately downstream of its connection point 6' with the emission line 4, a segment of receiving line that can be transformed in a controlled way into a section of line 11 by a quarter wave or lambda/4 ($\lambda/4$), for example by shortcircuiting to the ground (grounding) by a diode 12 controlled at suitable times, in relation to the other communication means.

The present invention also relates to an NMR spectrometric apparatus, characterized in that it comprises a circuit for excitation and recovery of the measuring signal as described above.

Finally, the invention also relates to a process for verification of the tuning between an NMR measuring probe and a generator for signals for the excitation or an amplification component of said signals, before their transmission by an emission line to said probe, in an NMR spectrometric apparatus of the mentioned type, characterized in that it consists in supplying the principal line 7' of the directive coupler 7 with a scanned signal, then pulling up, visualizing and analyzing the spectral response corresponding to the signal reflected by the measuring probe 1 at the terminal of the secondary line 7" opposite the terminal of the principal line 7' connected to the scanned signal generator 10.

It will be noted that the acquisition of the image of the mode of the probe is carried out directly in real time, without any correction or other supplemental mathematical operation.

When the directive coupler has possible imperfections, the verification process can, as a modification of what precedes, consist in establishing, prior to the verification phase of the tuning properly so called, the response or the spectral image of the transfer function of the directive coupler 7, then supplying the principal line 7' of said coupler 7 with a scanned signal, receiving and acquiring the spectral response corresponding to the signal reflected by the measuring probe 1 at the terminal of the secondary line 7" opposite the terminal of the secondary line 7" connected to the scanned signal generator 10, then subtracting the spectral response of the mentioned transfer function from the spectral response corresponding to the reflected signal of the probe 1 and, finally, visualizing and analyzing the resulting spectral image.

In the case of the circuit embodiment shown schematically in FIG. 5, the combination of the diodes 2 and 2'

(diodes for switching reflection emission) and of the directive coupler 7 thus permits avoiding imperfections of the coupler (for example in the case of wideband operation). It thus suffices to supply the coupler 7 with the generator 3 and open the circuit at 2', the measured reflected energy is thus the image of the transfer function of the coupler 7. By subtracting, the image of the mode of the measuring probe 1 can thus be presented, corrected of the imperfections of said coupler 7.

Of course, the invention is not limited to the embodiment described and shown in the accompanying drawings. Modifications remain possible, particularly as to the construction of the various elements or by substitution of technical equivalents, without thereby departing from the scope of protection of the invention.

What is claimed is:

1. Excitation circuit of a probe for measuring and recovering the signal emitted in return by this latter in an NMR spectrometric apparatus, connecting said probe, under conditions defined by switching means forming a portion of said circuit, to a high frequency excitation signal generator by a portion of the line or emission line and, by a portion of the line or reception line, to a receiver for the acquisition and exploitation of signals emitted by said probe as a function of the specimen to be analyzed which it contains, a device being, moreover, provided to carry out or verify the tuning of the measuring probe with the excitation signal generator, associated with or integrated into said circuit, which circuit is characterized in that said device comprises a directive coupler (7), mounted in series in or in parallel to the portion of the emission line (4).

2. Circuit according to claim 1, characterized in that the directive coupler (7) is mounted in parallel in the emission line (4) and connects, in a controlled manner, with this latter by its principal line by means of a switching element (2'), said principal line (7') being supplied, for verification of tuning, by a scanned signal and the secondary line (7") of said coupler (7) being connected, at its terminal opposite the terminal of the principal line supplied by the scanned signal, to a means (8) for the acquisition and visualization of the spectral response corresponding to the wave reflected by the measuring probe (1), preferably the means for acquisition and visualization of the spectrometric apparatus.

3. Circuit according to claim 1, characterized in that the directive coupler (7) is mounted in series in the emission line (4), in that the principal line (7') of said directive coupler (7) forms a portion of said emission line (4) and in that it is directly connected by the switching means (2, 9) to the excitation signal generator (3) or to the scanned signal generator (10), the secondary line (7") being connected or adapted to be connected, at its terminal opposite the terminal of the principal line (7') supplied by the signal from the excitation signal generator (3), to a means (8) for the acquisition and visualization of the wave reflected by the measuring probe (1), preferably the means for acquisition and visualization of the spectrometric apparatus.

4. Circuit according to claim 3, characterized in that the directive coupler (7) is mounted adjacent the output of the excitation signal generator (3) or of an amplification module or component (3') following it.

5. Circuit according to claim 3, characterized in that when the emission line (4) comprises switching means in the form of two diodes (2 and 2') mounted in series, the directive coupler (7) is mounted such that its principal line (7') forms at least a portion of the segment of emission line (4') extending between the two diodes (2 and 2').

6. Circuit according to claim 1, characterized in that the reception line (6) comprises, immediately downstream of its connection point (6') with the emission line (4), a segment of reception line that can be transformed in a controlled manner into a section of line (11) of quarter wave or lambda/4.

7. NMR spectrometric apparatus, characterized in that it comprises a circuit according to claim 1.

8. Process for the verification of the tuning between an NMR measuring probe and an excitation signal generator or an amplification component of said signals before their transmission by a transmission line toward said probe, in an NMR spectrometric apparatus according to claim 7, characterized in that it consists in supplying the principal line (7') of the directive coupler (7) by a scanned signal, then retrieving, visualizing and analyzing the spectral response corresponding to the signal reflected by the measuring probe (1) at the terminal of the secondary line (7") opposite the terminal of the principal line (7') connected to the scanned signal generator (10).

9. Process for the verification of the tuning between an NMR measuring probe and an excitation signal generator or a component for amplification of said signals before their transmission by an emission line toward said probe, in an NMR spectrometric apparatus according to claim 7, characterized in that it consists in establishing first the response or the spectral image of the transfer function of the directive coupler (7), then supplying the principal line (7') of said coupler (7) with a scanned signal, receiving and acquiring the spectral response corresponding to the signal reflected by the measuring probe (1) at the terminal of the secondary line (7") opposite the terminal of the secondary line (7") connected to the scanned signal generator (10), then subtracting the spectral response from the mentioned transfer function of the spectral response corresponding to the reflected signal of the probe (1) and, finally, visualizing and analyzing the resulting spectral image.

* * * * *